US009281351B2

(12) United States Patent
Kim et al.

(10) Patent No.: US 9,281,351 B2
(45) Date of Patent: Mar. 8, 2016

(54) ORGANIC LIGHT-EMITTING DISPLAY APPARATUS

(75) Inventors: Ki-Wook Kim, Yongin (KR); Dong-Wook Park, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 219 days.

(21) Appl. No.: 13/243,324

(22) Filed: Sep. 23, 2011

(65) Prior Publication Data
US 2012/0313098 A1 Dec. 13, 2012

(30) Foreign Application Priority Data
Jun. 13, 2011 (KR) .................. 10-2011-0057006

(51) Int. Cl.
H01L 29/49 (2006.01)
H01L 27/32 (2006.01)
H01L 51/50 (2006.01)

(52) U.S. Cl.
CPC .......... *H01L 27/326* (2013.01); *H01L 27/3248* (2013.01); *H01L 51/5012* (2013.01); *H01L 27/3246* (2013.01); *H01L 27/3276* (2013.01)

(58) Field of Classification Search
CPC .............. H01L 27/326; H01L 27/3248; H01L 51/5012
USPC .......... 313/504–506; 345/72, 83, 88, 90, 100; 257/59, 72, 40, E33.003, E33.004, 257/E29.273
See application file for complete search history.

(56) References Cited

U.S. PATENT DOCUMENTS

| 7,531,951 B2 * | 5/2009 | Yamanaka ..................... 313/461 |
| 7,605,784 B2 * | 10/2009 | Suh et al. ......................... 345/83 |
| 2006/0097628 A1 | 5/2006 | Suh et al. |
| 2007/0276091 A1 | 11/2007 | Son et al. |
| 2007/0285001 A1 * | 12/2007 | Tsai et al. ..................... 313/503 |
| 2010/0133988 A1 | 6/2010 | Kim |

FOREIGN PATENT DOCUMENTS

| KR | 10-2003-0075368 | 9/2003 |
| KR | 10-2006-0041121 | 5/2006 |
| KR | 10-2007-0032447 | 3/2007 |
| KR | 10-2007-0083129 | 8/2007 |
| KR | 10-2007-0113893 | 11/2007 |

* cited by examiner

*Primary Examiner* — Michael Shingleton
(74) *Attorney, Agent, or Firm* — Robert E. Bushnell, Esq.

(57) ABSTRACT

An organic light-emitting display apparatus may include a substrate; a thin-film transistor (TFT) disposed on the substrate, and having an active layer, a gate electrode, a source electrode and a drain electrode; a signal line formed on the same layer as the source electrode and the drain electrode; a first insulating layer covers the signal line, the source electrode, and the drain electrode; a pixel electrode formed on the first insulating layer, and electrically connected to the TFT; a pixel-defining layer formed on the first insulating layer, includes an opening exposing the pixel electrode; an intermediate layer formed on the pixel electrode, and includes a light-emitting layer; and an opposite electrode formed on the intermediate layer. The intermediate layer is formed on the pixel-defining layer so as to overlap with the signal line.

6 Claims, 3 Drawing Sheets

ORGANIC LIGHT-EMITTING DISPLAY APPARATUS

CLAIM OF PRIORITY

This application makes reference to, incorporates the same herein, and claims all benefits accruing under 35 U.S.C. §119 from an application earlier filed in the Korean Intellectual Property Office on the 13$^{th}$ of Jun. 2011 and there duly assigned Serial No. 10-2011-0057006.

BACKGROUND OF THE INVENTION

1. Field of the Invention

The present invention relates to one or more embodiment of an organic light-emitting display apparatus.

2. Description of the Related Art

In general, a flat display device is largely classified into a light-emitting type and a light-receiving type. Light-emitting type display devices include flat cathode ray tubes, plasma display panels, electroluminescent display devices, light-emitting diode display devices, or the like. Light-receiving type display devices include liquid crystal displays (LCDS) or the like. Among these display devices, electroluminescent display devices have advantages such as wide viewing angles, excellent contrast, and rapid response speeds, thus drawing attention to the electroluminescent display device as a next-generation display apparatus. Electroluminescent display devices may be an organic electroluminescent device or an inorganic electroluminescent device (e.g., organic light emitting display devices) according to the material forming a light-emitting layer.

The organic electroluminescent device is a self-emission display which performs electrical excitation of an organic fluorescent compound and emits light. The organic electroluminescent device allows driving at a low voltage, facilitates preparation of a thin film, and provides wide viewing angles and rapid response speeds, thereby drawing attention as a next-generation display apparatus which may solve problems with an LCD.

The organic electroluminescent device includes a light-emitting layer, which is formed of an organic material, between an anode electrode and a cathode electrode. In the organic electroluminescent device, as a positive electrode voltage and a negative electrode voltage are respectively applied to the anode electrode and the cathode electrode, a hole injected from the anode electrode moves to the light-emitting layer via a hole transport layer (HTL) and an electron moves from the cathode electrode to the light-emitting layer via a electron transport layer (ETL). Thus, an electron and a hole recombine at the light-emitting layer to thus generate an exciton.

When the excitons are changed from an excitation state to a ground state, fluorescent molecules of the light-emitting layer emit light, thus forming an image. A full-color organic electroluminescent device is formed to include a pixel which displays three colors including red, green and blue, thereby implementing full colors.

In such an organic electroluminescent device, a pixel-defining layer is formed on both edges of the anode electrode. Then, a predetermined opening is formed in the pixel-defining layer, and a light-emitting layer and a cathode electrode are sequentially formed on a surface of the anode electrode which is exposed by the opening.

SUMMARY OF THE INVENTION

One or more aspects of the present invention provide an organic light-emitting display apparatus in which a parasitic capacitance at a wiring is reduced.

According to an aspect of the present invention, there is provided an organic light-emitting display apparatus which may include a substrate; a thin-film transistor (TFT) which is disposed on the substrate and includes an active layer and a gate electrode which are insulated from each other, and a source electrode and a drain electrode which are electrically connected to each other; a signal line formed on the same layer as the source electrode and the drain electrode; a first insulating layer which covers the signal line, the source electrode, and the drain electrode; a pixel electrode which is formed on the first insulating layer and is electrically connected to the TFT; a pixel-defining layer which is formed on the first insulating layer and includes an opening exposing the pixel electrode; an intermediate layer which is formed on the pixel electrode and includes a light-emitting layer; and an opposite electrode which is formed on the intermediate layer. The intermediate layer may be formed on the pixel-defining layer so as to overlap with the signal line.

The first insulating layer, the pixel-defining layer, and the intermediate layer may be disposed between the signal line and the opposite electrode.

The intermediate layer may be formed on the pixel electrode, may extend over a side of the pixel electrode so as to correspond to the signal line, and may be formed on the pixel-defining layer.

A second insulating layer may be formed between the gate electrode and the source and drain electrodes, and the signal line, the source electrode and the drain electrode may be formed on the second insulating layer.

The neighboring intermediate layers may overlap with each other and may be disposed on the pixel-defining layer which corresponds to the signal line.

The intermediate layer may include a first common layer, the light-emitting layer, and a second common layer which are sequentially stacked, the first common layer and the second common layer may be commonly formed on the pixel-defining layer and the pixel electrode, and the light-emitting layer may be formed on the pixel electrode so as to extend to the pixel-defining layer which corresponds to the signal line.

The first common layer may include a hole injection layer (HIL) and a hole transport layer (HTL) which are sequentially stacked.

The second common layer may include an electron transport layer (ETL) and an electron injection layer (EIL) which are sequentially stacked.

According to another aspect of the present invention, there is provided an organic light-emitting display apparatus which may include a substrate; a thin-film transistor (TFT) which is disposed on the substrate and includes an active layer and a gate electrode which are insulated from each other, and a source electrode and a drain electrode which are electrically connected to each other; a signal line formed on the same layer as the source electrode and the drain electrode; a pixel electrode which is formed on the same layer as the gate electrode and is electrically connected to the TFT; a pixel-defining layer which covers the signal line, the source electrode and the drain electrode, and which includes an opening exposing the pixel electrode; an intermediate layer which is formed on the pixel electrode and includes a light-emitting layer; and an opposite electrode which is formed on the intermediate layer. The intermediate layer may be formed on the pixel-defining layer so as to overlap with the signal line.

The pixel-defining layer and the intermediate layer may be disposed between the signal line and the opposite electrode.

The intermediate layer may be formed on the pixel electrode, may extend from a side of the pixel electrode so as to correspond to the signal line, and may be formed on the pixel-defining layer.

The first insulating layer may be formed between the active layer and the gate electrode, the pixel electrode may be formed on the first insulating layer, and a second insulating layer may be formed between the gate electrode and the source and drain electrodes, and the signal line, the source electrode and the drain electrode may be formed on the second insulating layer.

The neighboring intermediate layers may overlap with each other and may be disposed on the pixel-defining layer which corresponds to the signal line.

The intermediate layer may include a first common layer, the light-emitting layer, and a second common layer which are sequentially stacked, the first common layer and the second common layer may be commonly formed on the pixel-defining layer and the pixel electrode, and the light-emitting layer may be formed on the pixel electrode so as to extend to the pixel-defining layer which corresponds to the signal line.

The first common layer may include a hole injection layer (HIL) and a hole transport layer (HTL) which are sequentially stacked.

The second common layer may include an electron injection layer (EIL) and an electron transport layer (ETL) which are sequentially stacked.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
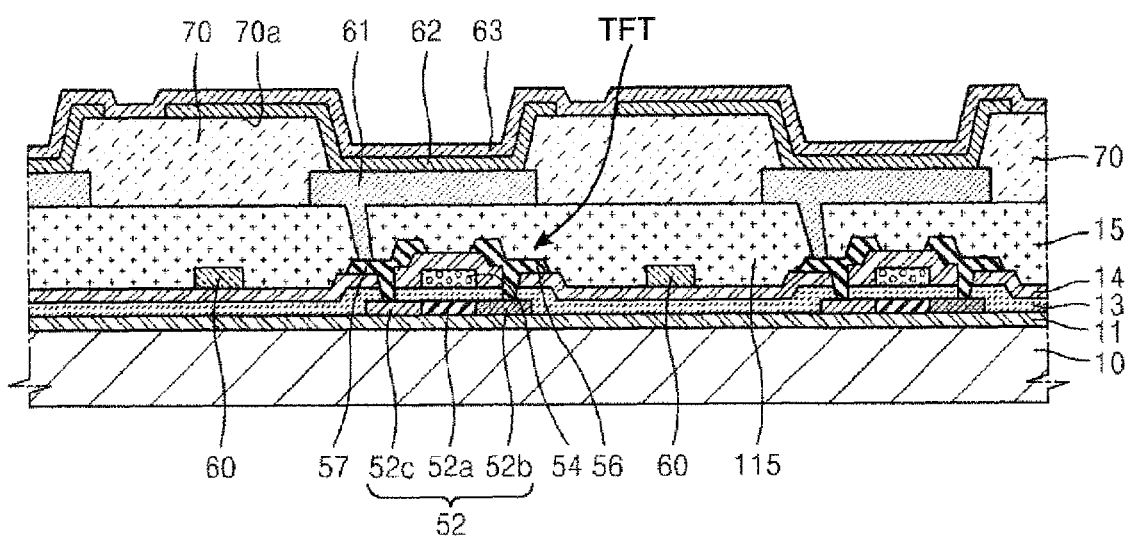
FIG. 1 is a schematic cross-sectional view of an organic light-emitting display apparatus according to an embodiment of the present invention.

As the invention allows for various changes and numerous embodiments, exemplary embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

While such terms as "first," "second," etc. may be used to describe various components, such components must not be limited to the above terms. The above terms are used only to distinguish one component from another.

The terms used in the present specification are merely used to describe exemplary embodiments, and are not intended to limit the present invention. An expression used in the singular encompasses the expression of the plural unless it has a clearly different meaning in the context. In the present specification, it is to be understood that the terms such as "including" or "having," etc. are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Hereinafter, the present invention will be described in detail by explaining exemplary embodiments of the invention with reference to the attached drawings.

FIG. 1 is a schematic cross-sectional view of an organic light-emitting display apparatus according to an embodiment of the present invention.

Referring to FIG. 1, the organic light-emitting display apparatus according to an embodiment of the present invention may include a substrate 10, a thin-film transistor (TFT), a pixel electrode 61, an intermediate layer 62, an opposite electrode 63, and a signal line 60. The TFT may include an active layer 52, a gate electrode 54, a source electrode 56, and a drain electrode 57.

Specifically, the substrate 10 may be formed of transparent glass having silicon dioxide ($SiO_2$) as a main component. However, the substrate 10 is not limited thereto, and it may also be formed of transparent plastic. The transparent plastic for forming the substrate 10 may be one selected from the group of insulating organic materials consisting of polyethersulphone (PES), polyacrylate (PAR), polyetherimide (PEI), polyethyelene naphthalate (PEN), polyethyelene terephthalate (PET), polyphenylene sulfide (PPS), polyallylate, polyimide, polycarbonate (PC), cellulose triacetate (TAC), and cellulose acetate propionate (CAP).

A buffer layer 11 may be formed on the substrate 10. The buffer layer 11 may provide a flat surface on the substrate 10 and prevents penetration of moisture and foreign substances into the substrate 10.

The active layer 52 may be formed on the buffer layer 11. The active layer 52 may be formed of an inorganic semiconductor or an organic semiconductor. The active layer 52 includes source and drain areas 52b and 52c, respectively. The source and drain areas 52b and 52c, respectively, are doped with an n-type or p-type impurity. The active layer 52 also may include a channel area 52a for connecting the source and drain areas 52b and 52c, respectively.

The inorganic semiconductor forming the active layer 52 may include cadmium sulfide (CdS), Gallium sulfide (GaS), Zinc sulfide (ZnS), Cadmium selenide (CdSe), Calcium selenide (CaSe), Zinc selenide (ZnSe), Cadmium telluride (CdTe), silicon carbide (SiC), or silicon (Si).

The organic semiconductor forming the active layer 52 may include a polymer organic material such as a polythiophene and a derivative thereof, a poly(p-phenylene vinylene) (PPV) and a derivative thereof, a poly(para-phenylene) (PPP) and a derivative thereof, a polythiophene vinylene and a derivative thereof, and a polythiophene-heterocyclic aromatic copolymer and a derivative thereof. The organic semiconductor may include a low-molecular weight organic material such as oligoacene of a pentacene, a tetracene, and a naphthalene and a derivative thereof, oligothiophene of alpha-5-thiophene and alpha-6-thiophene and a derivative thereof, phthalocyanine including or not including a metal and a derivative thereof, pyromellitic dianhydride and a derivative thereof, pyromellitic diimide and a derivative thereof, perylenetetracarboxylic dianhydride and a derivate thereof, and perylenetetracarboxylic diimide and a derivative thereof.

The active layer 52 is covered by a gate insulating layer 13. The gate electrode 54 may be formed on the gate insulating layer 13. The gate electrode 54 may be formed so as to cover an area corresponding to the channel area 52a of the active layer 52. The gate electrode 54 may be formed of a metal or a metal alloy such as gold (Au), silver (Ag), copper (Cu), nickel (Ni), platinum (Pt), palladium (Pd), aluminum (Al), an aluminum-neodymium (Al:Nd) alloy, or a molybdenum tungsten (Mo:W) alloy. However, the gate electrode 54 is not limited thereto, and may include various conductive materials. The gate electrode 54 may be connected to a gate line (not illustrated) which transmits ON and OFF signals to the TFT. The active layer 52 and the gate electrode 54 may be insulated from each other by the gate insulating layer 13.

A second insulating layer 14 is formed to cover the gate electrode 54. The source electrode 56 and the drain electrode 57 may be formed on the second insulating layer 14. The source electrode 56 and the drain electrode 57 may be connected to the source area 52b and the drain area 52c, respectively, of the active layer 52 through a contact hole formed in the gate insulating layer 13 and the second insulating layer 14.

The source electrode 56 and the drain electrode 57 may be formed of Au, Ag, Pd, Pt, Ni, rhodium (Rh), ruthenium (Ru), iridium (Ir), or osmium (Os). Besides these materials, the source electrode 56 and the drain electrode 57 may also be formed of two or more metal alloys using Al, molybdenum (Mo), an Al:Nd alloy, or a MoW alloy. However, the source electrode 56 and the drain electrode 57 are not limited thereto, and may be formed of other materials.

The signal line 60 may be formed on the second insulating layer 14 on which the source electrode 56 and the drain electrode 57 are formed. The signal line 60 is connected to the TFT and may transmit a signal from outside. The signal line 60 may be formed of the same material as the source electrode 56 and the drain electrode 57. Thus, the signal line 60, the source electrode 56 and the drain electrode 57 may be formed simultaneously by using one patterning process.

A first insulating layer 15 may be formed so as to cover the signal line 60, the source electrode 56 and the drain electrode 57. The first insulating layer 15 may be formed of inorganic materials such as silicon dioxide ($SiO_2$), silicon nitride (SiNx), and the like, or organic materials such as acryl, polyimide, Benzocyclobutene (BCB), and the like.

The pixel electrode 61 may be formed on the first insulating layer 15. The pixel electrode 61 may be connected to the drain electrode 57 through a via-hole. The pixel electrode 61 may be formed of a transmission electrode or a reflective electrode.

When the pixel electrode 61 is a transmission electrode, the pixel electrode 61 includes indium tin oxide (ITO), indium zinc oxide (IZO), zinc oxide (ZnO), or indium oxide ($In_2O_3$). When the pixel electrode 61 is a reflective electrode, the pixel electrode 61 is formed by forming a reflective layer using at least one material consisting of Ag, magnesium (Mg), Al, Pt, Pd, Au, Ni, neodymium (Nd), Ir, chrome (Cr), and a combination thereof, and then forming a layer on the reflective layer using ITO, IZO, ZnO, or $In_2O_3$.

In the current embodiment, the drain electrode 57 is connected to the pixel electrode 61. However, the present invention is not limited thereto, and the source electrode 56 may be connected to the pixel electrode 61.

A pixel-defining layer 70 may be formed on the first insulating layer 15. The pixel-defining layer 70 contains various insulating materials and includes an opening exposing a predetermined area of the pixel electrode 61. The intermediate layer 62 may be formed on the exposed pixel electrode 61. The opposite electrode 63 may be formed on the intermediate layer 62. The intermediate layer 62 may also be formed on an area 70a of the pixel-defining layer 70 which corresponds to the signal line 60, as well as on the pixel electrode 61, as described below.

The intermediate layer 62 includes a light-emitting layer (not illustrated). The light-emitting layer may emit light when a voltage is applied to the pixel electrode 61 and the opposite electrode 63.

When the light-emitting layer of the intermediate layer 62 is formed of a low-molecular weight organic material, a hole transport layer (HTL) and a hole injection layer (HIL) are disposed between the light-emitting layer and the pixel electrode 61, and an electron transport layer (ETL) and an electron injection layer (EIL) are disposed between the light-emitting layer and the opposite electrode 63. Besides these layers, other layers may be disposed as necessary. Various organic materials that may be used include copper phthalocyanine (CuPc), N,N'-Di(naphthalene-1-yl)-N,N'-diphenyl-benzidine (NPB), tris-8-hydroxyquinoline aluminum (Alq3), and the like.

When the light-emitting layer of the intermediate layer 62 is formed of a polymer organic material, the HTL may be included between the light-emitting layer and the pixel electrode 61. The HTL may be formed of poly-(2,4)-ethylene-dihydroxy thiophene (PEDOT) or polyaniline (PANI). Organic materials that may be used include polymer organic materials such as PolyPhenylene Vinylene (PPV), Polyfluorene, and the like.

The opposite electrode 63 is formed to cover all pixels. The opposite electrode 63 may be a transmission electrode or a reflective electrode.

When the opposite electrode 63 is a transmission electrode, the opposite electrode 63 is formed by stacking a layer which is formed of lithium (Li), calcium (Ca), lithium-fluoride-calcium (LiF/Ca), lithium-fluoride-aluminum (LiF/Al), Al, Ag, Mg or a combination thereof and a transmissive conductive layer which is formed of ITO, IZO, ZnO, or $In_2O_3$. When the opposite electrode 63 is a reflective electrode, the opposite electrode 63 includes Li, Ca, LiF/Ca, LiF/Al, Al, Ag, Mg, or a combination thereof.

In the current embodiment, the pixel electrode 61 and the opposite electrode 63 are assumed to be an anode electrode and a cathode electrode, respectively. However, the present invention is not limited thereto, and the polarity of the pixel electrode 61 and the polarity of the opposite electrode 63 may be the opposite thereto. Furthermore, materials forming the pixel electrode 61 and the opposite electrode 63 are illustrative examples of the invention. Thus, other materials may be used to form the pixel electrode 61 and the opposite electrode 63.

A sealing member (not illustrated) may be disposed on the opposite electrode 63. The sealing member (not illustrated) is formed to protect the intermediate layer 62 and other layers from external moisture or oxygen. The sealing member (not illustrated) is formed of a transparent material. The sealing member (not illustrated) may also be formed in a multi-layer structure in which glass, plastic, or organic and inorganic materials overlap.

The opposite electrode 63, which is a common electrode, is formed on an entire surface of the substrate 10. The signal line 60 is disposed below the opposite electrode 63. Therefore, a parasitic capacitance is generated between the opposite electrode 63 and the signal line 60. The parasitic capacitance may deteriorate the performance of the organic light-emitting display apparatus, for example, a signal delay.

According to an embodiment of the present invention, the intermediate layer 62 is formed to extend on the pixel-defining layer 70 on an area corresponding to the signal line 60, thus decreasing the parasitic capacitance generated between the opposite electrode 63 and the signal line 60. That is, the intermediate layer 62 is formed on the pixel electrode 61 and extends from a side of the pixel electrode 61 to the pixel-defining layer 70 so as to overlap with the signal line 60. Referring to FIG. 1, the intermediate layer 62 may also be formed on the area 70a of the pixel-defining layer 70 which corresponds to the signal line 60. Accordingly, the first insulating layer 15, the pixel-defining layer 70, and the intermediate layer 62 are interposed between the signal line 60 and the opposite electrode 63. Besides, a parasitic capacitance at the first insulating layer 15, a parasitic capacitance at the pixel-defining layer 70, and a parasitic capacitance at the intermediate layer 62 are connected in series. Accordingly, the entire parasitic capacitance between the signal line 60 and the opposite electrode 63 may be reduced, thus minimizing deterioration of characteristics of the TFT.

Figure 2:
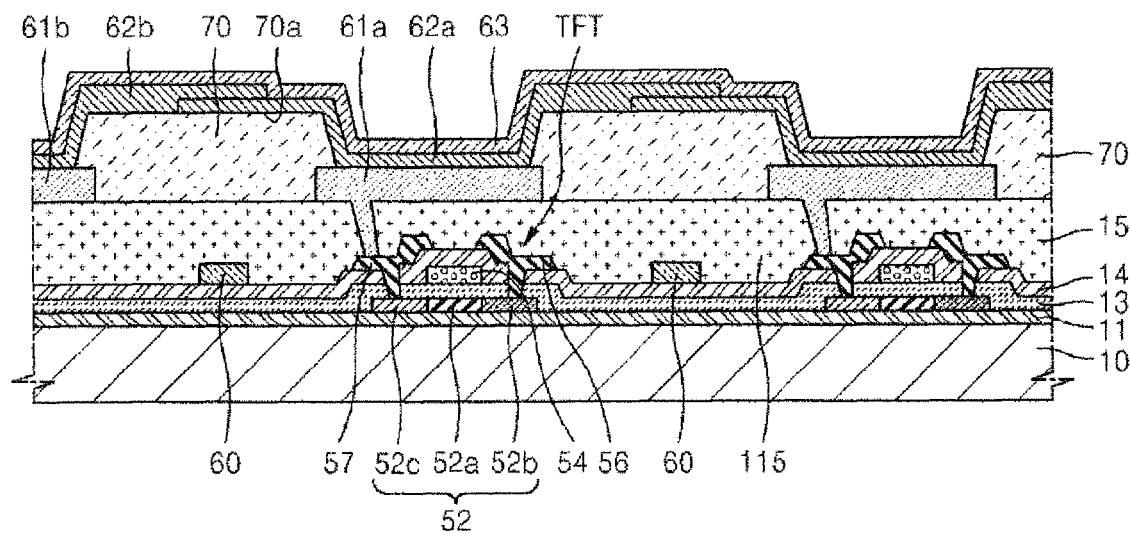
FIG. 2 is a schematic cross-sectional view of an organic light-emitting display apparatus according to another embodiment of the present invention.

FIG. 2 is a schematic cross-sectional view of an organic light-emitting display apparatus according to another embodiment of the present invention.

Referring to FIG. 2, the organic light-emitting display apparatus according to another embodiment of the present invention may include a substrate 10, a TFT, pixel electrodes 61a and 61b, intermediate layers 62a and 62b, an opposite electrode 63, and a signal line 60. The TFT may include an active layer 52, a gate electrode 54, a source electrode 56, and a drain electrode 57.

The organic light-emitting display apparatus illustrated in FIG. 2 differs from the organic light-emitting display apparatus of FIG. 1 in terms of disposition of the intermediate layers 62a and 62b. Referring to FIG. 2, the neighboring intermediate layers 62a and 62b may overlap with each other and may be disposed on an area 70a of a pixel-defining layer 70 which corresponds to the signal line 60. The intermediate layer 62a is disposed on the pixel electrode 61a, and the intermediate layer 62b is disposed on the pixel electrode 61b which is disposed to the left of the pixel electrode 61a. The intermediate layers 62a and 62b are disposed on the pixel electrodes 61a and 61b, respectively, and extend over a side of the pixel electrodes 61a and 61b, respectively, on the area 70a of the pixel-defining layer 70. Thus, on the area 70a of the pixel-defining layer 70, the intermediate layer 62a may be disposed below the intermediate layer 62b. In the organic light-emitting display apparatus illustrated in FIG. 2, a first insulating layer 15, the pixel-defining layer 70, the intermediate layer 62a, and the intermediate layer 62b are sequentially interposed between the signal line 60 and the opposite electrode 63, thus minimizing an overall parasitic capacitance.

Figure 3:
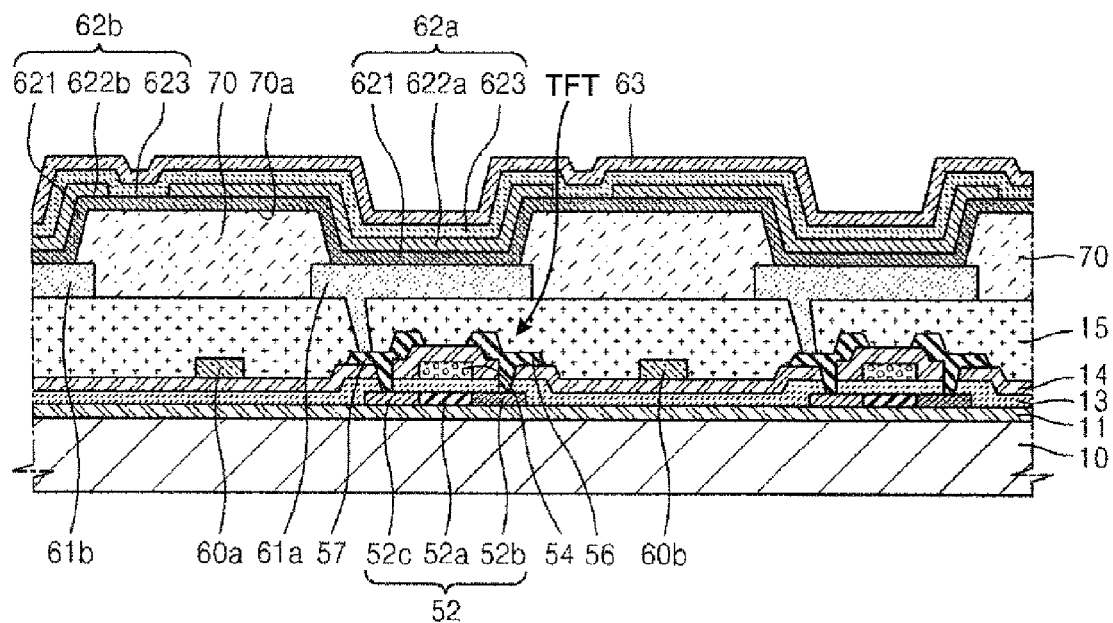
FIG. 3 is a schematic cross-sectional view of an organic light-emitting display apparatus according to another embodiment of the present invention.

FIG. 3 is a schematic cross-sectional view of an organic light-emitting display apparatus according to another embodiment of the present invention.

Referring to FIG. 3, the organic light-emitting display apparatus according to another embodiment of the present invention may include a substrate 10, a TFT, pixel electrodes 61a and 61b, intermediate layers 62a and 62b, an opposite electrode 63, and a signal line 60a. The TFT may include an active layer 52, a gate electrode 54, a source electrode 56, and a drain electrode 57.

The organic light-emitting display apparatus illustrated in FIG. 3 differs from the organic light-emitting display apparatus of FIG. 1 in terms of the structure and disposition of the intermediate layers 62a and 62b. Referring to FIG. 3, the intermediate layer 62a may include a first common layer 621, a light-emitting layer 622a, and a second common layer 623. The intermediate layer 62b may include the first common layer 621, a light-emitting layer 622b, and the second common layer 623. Like the opposite electrode 63, the first common layer 621 and the second common layer 623 are commonly formed on an entirety of the pixel defining layer 70 and an entirety of the pixel electrodes 61a and 61b over an entire surface of the substrate 10. However, the light-emitting layers 622a and 622b may be formed on the pixel layers 61a and 61b, respectively, between the first common layer 621 and the second common layer 623. The first common layer may be formed of a HTL and a HIL. The second common layer 623 may be formed of an ETL and an EIL.

The light-emitting layers 622a and 622b may be formed so as to extend to an area 70a of the pixel-defining layer 70 which corresponds to the signal line 60a. That is, the light-emitting layer 622a, which is formed on the pixel electrode 61a, may extend over a side of the pixel electrodes 61a on the area 70a of the pixel-defining layer 70 which corresponds to the signal line 60a. Thus, a first insulating layer 15, the pixel-defining layer 70, the first common layer 612, the light-emitting layer 622a, and the second common layer 623 are interposed between the signal line 60a and the opposite electrode 63, thus minimizing an overall parasitic capacitance between the signal line 60a and the opposite electrode 63.

Figure 4:
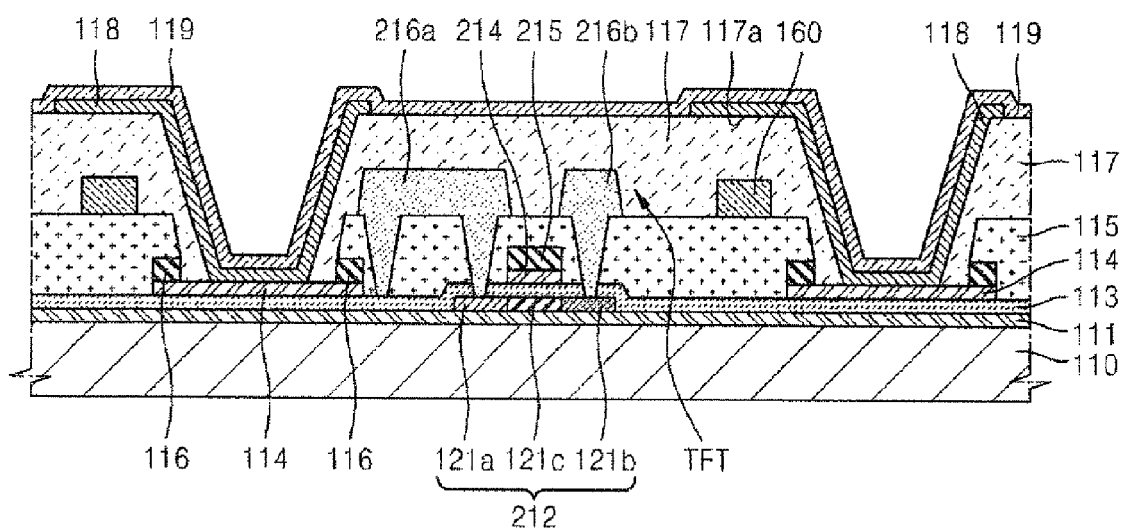
FIG. 4 is a schematic cross-sectional view of an organic light-emitting display apparatus according to another embodiment of the present invention.

FIG. 4 is a schematic cross-sectional view of an organic light-emitting display apparatus according to another embodiment of the present invention.

Referring to FIG. 4, the organic light-emitting display apparatus according to another embodiment of the present invention may include a substrate 110, a TFT, a pixel electrode 114, an intermediate layer 118, an opposite electrode 119, and a signal line 160. The TFT may include an active layer 212, first and second gate electrodes 214 and 215, respectively, a source electrode 216b, and a drain electrode 216a.

A buffer layer 111 may be formed so as to provide a flat surface on the substrate 101 and prevent penetration of moisture and foreign substances into the substrate 110.

The active layer 212 of the TFT may be formed on the buffer layer 111. The active layer 212 may be formed of a semiconductor which includes amorphous silicon or crystalline silicon. The active layer 212 may include source and drain areas 121b and 121a, respectively, which are doped with an ion impurity, and a channel area 121c.

On the active layer 212, the first gate electrode 214 and the second gate electrode 215, which include a transparent conductive material, may be sequentially formed at a location which corresponds to the channel area 121c of the active layer 212, with a first insulating layer 113 interposed therebetween.

The source and drain electrodes 216b and 216a, respectively, connected to the source and drain areas 121b and 121a, respectively, of the active layer 212, are formed on the first and second gate electrodes 214 and 215, respectively, with a second insulating layer 115 interposed therebetween. A pixel-defining layer 117 may be formed on the second insulating layer 115 so as to cover the source and drain electrodes 216b and 216a, respectively.

A first pixel electrode 114, which is formed of the same material as the first gate electrode 214, and a second pixel electrode 116, which is formed of the same material as the second gate electrode 215 and which is located on edges of the first pixel electrode 114, are sequentially formed on the substrate 110, the buffer layer 111 and the first insulating layer 113.

The current embodiment illustrates a structure in which the second pixel electrode 116 is located on edges of the first pixel electrode 114. However, the present invention is not limited thereto, and may also include a structure in which the second pixel electrode 116 is not on the first pixel electrode 114.

An opposite electrode 119 may be included at a location which faces the first pixel electrode 114. The intermediate layer 118, which includes a light-emitting layer (not illustrated), may be formed between the first pixel electrode 114 and the opposite electrode 119.

A light-emitting layer of the intermediate layer 118 may be formed of a polymer organic material or a low-molecular weight organic material. When the light-emitting layer of the intermediate layer 118 is formed of a low-molecular weight organic material, a hole transport layer (HTL) and a hole injection layer (HIL) are disposed between the light-emitting layer and the pixel electrode 114, and an electron transport layer (ETL) and an electron injection layer (EIL) are disposed between the light-emitting layer and the opposite electrode 119. Besides these layers, other layers may be stacked as desired. Various organic materials, such as copper phthalocyanine (CuPc), N,N'-Di(naphthalene-1-yl)-N,N'-diphenyl-benzidine (NPB), and tris-8-hydroxyquinoline aluminum (Alq3), may be used.

When the light-emitting layer of the intermediate layer 118 is formed of a polymer organic material, the HTL as well as the light-emitting layer may be included. The HTL may be formed by using PEDOT or PANI. Organic materials that may be used include polymer organic materials, such as PPV, Polyfluorene, and the like.

The opposite electrode 119 may be deposited on the intermediate layer 118 as a common electrode. In the case of the organic light-emitting display apparatus according to the current embodiment, the first and second pixel electrodes 114 and 116, respectively, may be used as anode electrodes, and the opposite electrode 119 may be used as a cathode electrode, or vice versa.

The opposite electrode 119 may be formed as a reflective electrode which includes a reflective material. The opposite electrode 119 may include at least one material from the group consisting of Ag, Mg, Li, Ca, LiF/Ca, and LiF/Al.

When the opposite electrode 119 is included as a reflective electrode, light emitted from the intermediate layer 118 is reflected by the opposite electrode 119, penetrates the first pixel electrode 114 which is formed of a transparent conductive material, and is emitted toward the substrate 110.

A sealing member (not illustrated) may be disposed on the opposite electrode 119. The sealing member (not illustrated) is formed to protect the intermediate layer 118 and other layers from external moisture or oxygen. The sealing member (not illustrated) is formed of a transparent material. The sealing member (not illustrated) may also be formed in a multi-layer structure in which glass, plastic, or organic and inorganic materials overlap.

In the current embodiment, the intermediate layer 118 is formed so as to extend to the pixel-defining layer 117, thus minimizing a parasitic capacitance generated between the opposite electrode 119 and the signal line 160. That is, the intermediate layer 118 may be formed on the pixel electrode 114 and may extend from a side of the pixel electrode 114 to the pixel-defining layer 117 so as to overlap with the signal line 160. Referring to FIG. 4, the intermediate layer 118 may also be formed on an area 117a on the pixel-defining layer 117 which corresponds to the signal line 160. Accordingly, the pixel-defining layer 117 and the intermediate layer 118 are interposed between the signal line 160 and the opposite electrode 119, and a parasitic capacitance at the pixel-defining layer 117 and a parasitic capacitance at the intermediate layer 118 are connected in series with each other, thereby minimizing an entire parasitic capacitance between the signal line 160 and the opposite electrode 119. Therefore, deterioration of characteristics of the TFT may be minimized.

Figure 5:
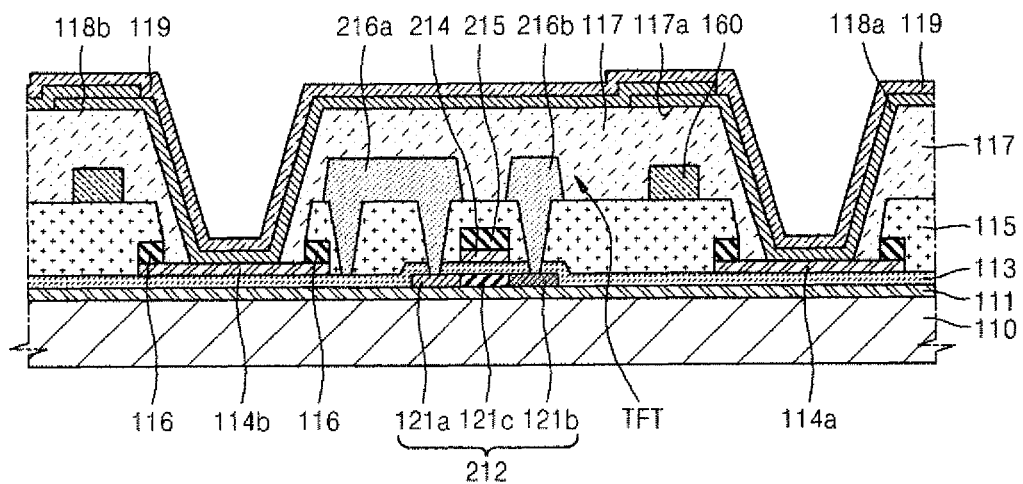
FIG. 5 is a schematic cross-sectional view of an organic light-emitting display apparatus according to another embodiment of the present invention.

FIG. 5 is a schematic cross-sectional view of an organic light-emitting display apparatus according to another embodiment of the present invention.

Referring to FIG. 5, the organic light-emitting display apparatus may include a substrate 110, a TFT, pixel electrodes 114a and 114b, intermediate layers 118a and 118b, an opposite electrode 119, and a signal line 160. The TFT may include an active layer 212, gate electrodes 214 and 215, a source electrode 216b, and a drain electrode 216a.

The organic light-emitting display apparatus illustrated in FIG. 5 differs from the organic light-emitting display apparatus of FIG. 4 in terms of disposition of the intermediate layers 118a and 118b. Referring to FIG. 5, the neighboring intermediate layers 118a and 118b may overlap with each other at an area 117a of a pixel-defining layer 117 which corresponds to the signal line 160. The intermediate layer 118a is disposed on the pixel electrode 114a, and the intermediate layer 118b is disposed on the pixel electrode 114b which is disposed to the left of the pixel electrode 114a. The intermediate layers 118a and 118b are disposed on the pixel electrodes 114a and 114b, respectively, and extend over a side of the pixel electrodes 114a and 114b, respectively, at the area 117a of the pixel-defining layer 70. Thus, at the area 117a of the pixel-defining layer 117, the intermediate layer 118a may be disposed below the intermediate layer 118b. In the organic light-emitting display apparatus illustrated in FIG. 5, the pixel-defining layer 117, the intermediate layer 118a and the intermediate layer 118b are sequentially interposed between the signal line 160 and the opposite electrode 119, thus decreasing an entire parasitic capacitance.

Figure 6:
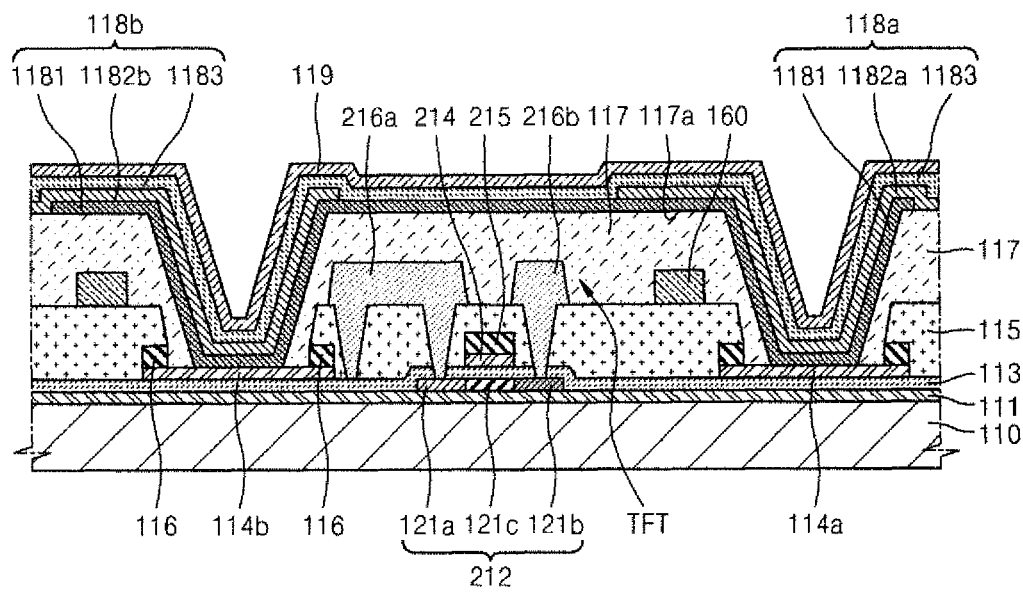
FIG. 6 is a schematic cross-sectional view of an organic light-emitting display apparatus according to another embodiment of the present invention.

FIG. 6 is a schematic cross-sectional view of an organic light-emitting display apparatus according to another embodiment of the present invention.

Referring to FIG. 6, the organic light-emitting display apparatus according to the present embodiment of the present invention may include a substrate 110, a TFT, pixel electrodes 114a and 114b, intermediate layers 118a and 118b, an opposite electrode 119, and a signal line 160. The TFT may include an active layer 212, gate electrodes 214 and 215, a source electrode 216b, and a drain electrode 216a.

The organic light-emitting display apparatus illustrated in FIG. 6 differs from the organic light-emitting display apparatus of FIG. 4 in terms of structure and disposition of the intermediate layers 118a and 118b. Referring to FIG. 6, the intermediate layer 118a includes a first common layer 1181, a light-emitting layer 1182a, and a second common layer 1183. The intermediate layer 118b may include the first common layer 1181, a light-emitting layer 1182b, and the second common layer 1183. Like the opposite electrode 119, the first common layer 1181 and the second common layer 1183 are commonly formed on an entirety of the pixel-defining layer 117 and an entirety of the pixel electrodes 114a and 114b over an entire surface of the substrate 110. However, the light-emitting layers 1182a and 1182b are formed on the pixel electrodes 114a and 114b, respectively, between the first common layer 1181 and the second common layer 1183.

The first common layer 1181 may be formed of a HTL and a HIL. The second common layer 1183 may be formed of an ETL and an EIL.

The light-emitting layers 1182a and 1182b may be formed to extend on an area 117a of the pixel-defining layer 117 which corresponds to the signal line 160. That is, the light-emitting layer 1182a, which is formed on the pixel electrode 114a, may extend over a side of the pixel electrode 114a and may be formed on the area 117a of the pixel-defining layer 117 which corresponds to the signal line 160. Thus, the pixel-defining layer 117, the first common layer 1181, the light-emitting layer 1182a, and the second common layer 1183 are interposed between the signal line 160 and the opposite electrode 119, thus minimizing an overall parasitic capacitance between the signal line 160 and the opposite electrode 119.

According to embodiments of the present invention, a parasitic capacitance of an organic light-emitting display apparatus may be reduced.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. An organic light-emitting display apparatus, comprising:
   a substrate;
   a thin-film transistor (TFT) which is disposed on the substrate, and which has an active layer and a gate electrode insulated from each other, and a source electrode and a drain electrode electrically connected to each other;
   a signal line formed on a same layer as the source electrode and the drain electrode;
   a first insulating layer which covers the signal line, the source electrode and the drain electrode;
   a pixel electrode which is formed on the first insulating layer, and which is electrically connected to the TFT;
   a pixel-defining layer which is formed on the first insulating layer, and which comprises an opening exposing the pixel electrode;
   a first common layer and a second common layer which are commonly formed on the pixel-defining layer and the pixel electrode, the first common layer and the second common layer overlapping the signal line, the first common layer contacting the pixel-defining layer and the pixel electrode;
   a light-emitting layer interposed between the first common layer and the second common layer, the light-emitting layer formed on the pixel electrode so as to extend on a portion of the pixel-defining layer, the portion overlapping the signal line; and
   an opposite electrode which is formed on the second common layer.

2. The organic light-emitting display apparatus of claim 1, wherein the first common layer has a hole injection layer (HIL) and a hole transport layer (HTL) which are sequentially stacked.

3. The organic light-emitting display apparatus of claim 1, wherein the second common layer has an electron transport layer (ETL) and an electron injection layer (EIL) which are sequentially stacked.

4. An organic light-emitting display apparatus, comprising:
   a substrate;
   a thin-film transistor (TFT) which is disposed on the substrate, and which has an active layer and a gate electrode insulated from each other, and a source electrode and a drain electrode electrically connected to each other;
   a signal line formed on a same layer as the source electrode and the drain electrode;
   a pixel electrode which is formed on a same layer as the gate electrode, and which is electrically connected to the TFT;
   a pixel-defining layer which covers the signal line, the source electrode and the drain electrode, and which has an opening exposing the pixel electrode;
   a first common layer and a second common layer which are commonly formed on the pixel-defining layer and the pixel electrode, the first common layer and the second common layer overlapping the signal line, the first common layer contacting the pixel-defining layer and the pixel electrode;
   a light-emitting layer interposed between the first common layer and the second common layer, the light-emitting layer formed on the pixel electrode so as to extend on a portion of the pixel-defining layer, the portion overlapping the signal line; and
   an opposite electrode which is formed on the second common layer.

5. The organic light-emitting display apparatus of claim 4, wherein the first common layer has a hole injection layer (HIL) and a hole transport layer (HTL) which are sequentially stacked.

6. The organic light-emitting display apparatus of claim 4, wherein the second common layer comprises an electron transport layer (ETL) and an electron injection layer (EIL) which are sequentially stacked.

* * * * *